United States Patent
Zhou et al.

(10) Patent No.: US 12,029,103 B2
(45) Date of Patent: Jul. 2, 2024

(54) FLEXIBLE DISPLAY APPARATUS

(71) Applicant: BOE Technology Group Co., Ltd., Beijing (CN)

(72) Inventors: Yonghong Zhou, Beijing (CN); Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 383 days.

(21) Appl. No.: 16/762,621

(22) PCT Filed: Jan. 17, 2020

(86) PCT No.: PCT/CN2019/125613
§ 371 (c)(1),
(2) Date: May 8, 2020

(87) PCT Pub. No.: WO2020/155891
PCT Pub. Date: Aug. 6, 2020

(65) Prior Publication Data
US 2020/0358013 A1  Nov. 12, 2020

(51) Int. Cl.
*H10K 77/10* (2023.01)
*B32B 3/08* (2006.01)
(Continued)

(52) U.S. Cl.
CPC .............. *H10K 77/111* (2023.02); *B32B 3/08* (2013.01); *B32B 5/18* (2013.01); *B32B 15/04* (2013.01);
(Continued)

(58) Field of Classification Search
CPC ........... H01L 51/0097; G02F 1/133305; G06F 1/1652; H04M 1/0268; H04M 1/0216
See application file for complete search history.

(56) References Cited

U.S. PATENT DOCUMENTS 10,637,007 B1    4/2020  Wang et al.
2006/0196946 A1* 9/2006  Tsai ..................... H04N 5/2254
                                                        235/472.01
(Continued)

FOREIGN PATENT DOCUMENTS

CN    206136441 U    4/2017
CN    107864552 A    3/2018
(Continued)

OTHER PUBLICATIONS

International Search Report & Written Opinion mailed Mar. 20, 2020, regarding PCT/CN/2019/125613.
(Continued)

*Primary Examiner* — Yuzhen Shen
(74) *Attorney, Agent, or Firm* — Intellectual Valley Law, P.C.

(57) ABSTRACT

A flexible display apparatus is provided. The flexible display apparatus includes a unitary flexible display panel having a display area, a peripheral area, and a bendable area connecting the display area and the peripheral area, wherein the bendable area includes one or more wire-free portions configured to absorb impact applied on the bendable area; a support sandwiched between the display area and the peripheral area, wherein the support has a first side, a second side facing the first side, and a third side connecting the first side and the second side, the display area is on the first side, the peripheral area is on the second side, and the unitary flexible display panel is bend about the third side; and a driving circuit in the peripheral area and connecting to a plurality of signal lines extending through the bendable area into the display area.

12 Claims, 5 Drawing Sheets

(51) Int. Cl.

| | |
|---|---|
| *B32B 5/18* | (2006.01) |
| *B32B 15/04* | (2006.01) |
| *B32B 15/18* | (2006.01) |
| *B32B 15/20* | (2006.01) |
| *B32B 27/06* | (2006.01) |
| *B32B 27/30* | (2006.01) |
| *B32B 27/36* | (2006.01) |
| *G02F 1/1345* | (2006.01) |
| *G06F 1/16* | (2006.01) |
| *H04M 1/02* | (2006.01) |
| *H10K 59/131* | (2023.01) |
| *G02F 1/1333* | (2006.01) |
| *H10K 102/00* | (2023.01) |

(52) U.S. Cl.
CPC .............. *B32B 15/18* (2013.01); *B32B 15/20* (2013.01); *B32B 27/06* (2013.01); *B32B 27/302* (2013.01); *B32B 27/365* (2013.01); *G02F 1/13452* (2013.01); *G06F 1/1652* (2013.01); *G06F 1/1656* (2013.01); *H04M 1/0268* (2013.01); *H10K 59/131* (2023.02); *G02F 1/133305* (2013.01); *G02F 2201/503* (2013.01); *H10K 2102/311* (2023.02)

(56) References Cited

U.S. PATENT DOCUMENTS

| | | | | |
|---|---|---|---|---|
| 2014/0353670 | A1* | 12/2014 | Youn | H01L 27/3288 |
| | | | | 438/586 |
| 2016/0064466 | A1* | 3/2016 | Son | H01L 27/323 |
| | | | | 445/24 |
| 2016/0073528 | A1* | 3/2016 | Park | H01L 51/529 |
| | | | | 361/752 |
| 2016/0270234 | A1* | 9/2016 | Ahn | H05K 1/189 |
| 2017/0150032 | A1* | 5/2017 | Chenn | H04N 23/66 |
| 2018/0123060 | A1* | 5/2018 | Jang | H10K 77/111 |
| 2018/0182983 | A1* | 6/2018 | Bae | B32B 9/005 |
| 2018/0294427 | A1 | 10/2018 | Lee | |
| 2018/0301520 | A1 | 10/2018 | Jin et al. | |
| 2019/0018458 | A1 | 1/2019 | Turchin et al. | |
| 2019/0037694 | A1* | 1/2019 | Koo | G06F 1/1626 |
| 2019/0041554 | A1* | 2/2019 | Shih | G02B 5/005 |
| 2019/0058028 | A1* | 2/2019 | Won | H01L 51/5253 |
| 2019/0139905 | A1 | 5/2019 | Cheng et al. | |
| 2019/0207130 | A1 | 7/2019 | He et al. | |
| 2020/0066821 | A1* | 2/2020 | Saitoh | H05B 33/10 |
| 2020/0150725 | A1* | 5/2020 | Saitoh | H01L 51/0097 |

FOREIGN PATENT DOCUMENTS

| | | | | |
|---|---|---|---|---|
| CN | 108198842 | A | | 6/2018 |
| CN | 108231854 | A | | 6/2018 |
| CN | 108281387 | A | | 7/2018 |
| CN | 207650511 | U | | 7/2018 |
| CN | 207689795 | U | | 8/2018 |
| CN | 108628500 | A | | 10/2018 |
| CN | 108695343 | A | | 10/2018 |
| CN | 108878483 | A | | 11/2018 |
| CN | 108924291 | A | | 11/2018 |
| CN | 108962035 | A | | 12/2018 |
| CN | 109887928 | A | * 6/2019 ............ H01L 27/12 |
| EP | 3383147 | A1 | | 10/2018 |

OTHER PUBLICATIONS

First Office Action in the Chinese Patent Application No. 201910103742.X, dated Jan. 6, 2020; English translation attached.

Second Office Action in the Chinese Patent Application No. 201910103742.X, dated Jun. 10, 2020; English translation attached.

Third Office Action in the Chinese Patent Application No. 201910103742.X, dated Aug. 31, 2020; English translation attached.

\* cited by examiner

FLEXIBLE DISPLAY APPARATUS

CROSS-REFERENCE TO RELATED APPLICATION

This application is a national stage application under 35 U.S.C. § 371 of International Application No. PCT/CN2019/125613, filed Dec. 16, 2019, which claims priority to Chinese Patent Application No. 201910103742.X, filed Feb. 1, 2019. Each of the forgoing applications is herein incorporated by reference in its entirety for all purposes.

TECHNICAL FIELD

The present invention relates to display technology, more particularly, to a flexible display apparatus.

BACKGROUND

Usually, a flexible display apparatus includes a flexible display panel and a cover plate. The cover plate can only prevent the flexible display panel from being damaged under a relatively small impact.

Especially, a flexible display panel is bended on an edge of a display area of the flexible display panel to form a bendable area. A lot of signal lines in the bendable area are also bended. Because the flexible display panel uses relatively thin signal lines, when an impact is applied on a lateral side of the flexible display apparatus which is closer to the bendable area, the case of the flexible display apparatus on the lateral side may hit the signal lines in the bendable area, and break the signal lines or cause deformations of the flexible display panel.

SUMMARY

In one aspect, the present invention provides a flexible display apparatus, comprising a unitary flexible display panel having a display area, a peripheral area, and a bendable area connecting the display area and the peripheral area, wherein the bendable area includes one or more wire-free portions configured to absorb impact applied on the bendable area; a support sandwiched between the display area and the peripheral area, wherein the support has a first side, a second side facing the first side, and a third side connecting the first side and the second side, the display area is on the first side, the peripheral area is on the second side, and the unitary flexible display panel is bend about the third side; and a driving circuit in the peripheral area and connecting to a plurality of signal lines extending through the bendable area into the display area; wherein at least one of the plurality of signal lines is a curved signal line including a first portion in the peripheral area, a second portion in the display area, and a third portion at least partially in the bendable area and connecting the first portion and the second portion; a virtual extension of at least one of the first portion or the second portion passes through a respective one of the one or more wire-free portions; and the third portion is substantially outside the respective one of the one or more wire-free portions.

Optionally, a virtual extension of the first portion is outside a respective one of the one or more wire-free portions; and a virtual extension of the second portion passes through the respective one of the one or more wire-free portions.

Optionally, a straight virtual line connecting the first portion and the second portion passes through a respective one of the one or more wire-free portions; and the third portion is a curved signal line portion detouring around the respective one of the one or more wire-free portions.

Optionally, the one or more wire-free portions of the bendable area are free of any of the plurality of signal lines.

Optionally, an aperture is in the respective one of the one or more wire-free portions and extends through the respective one of the one or more wire-free portions of the bendable area.

Optionally, the flexible display apparatus further comprises a bumper in the aperture; wherein a thickness of the bumper is greater than a thickness of the unitary flexible display panel in the bendable area.

Optionally, the bumper and the support are portions of a unitary structure; and the bumper is a portion of the support protruding from the third side of the support.

Optionally, the aperture partially exposes edges of the third side intersecting the first side and the second side of the support.

Optionally, a total number of the one or more wire-free portions is one; the aperture is in a central region of the bendable area; and an area of the aperture is in a range of approximately 3 $mm^2$ to approximately 40 $mm^2$.

Optionally, a cross-section of the aperture along a plane substantially parallel to the third side and crossing over the aperture has a substantially elliptical shape; and a minor axis of the substantially elliptical shape is substantially perpendicular to the first side and the second side of the support.

Optionally, a bumper is on the respective one of the one or more wire-free portions, and configured to absorb impact applied on the bendable area.

Optionally, the bumper is between the third side of the support and a side of the respective one of the one or more wire-free portions closer to the support.

Optionally, the bumper is on a side of the respective one of the one or more wire-free portions away from to the support.

Optionally, a total number of the one or more wire-free portions is one; the bumper is in a central region of the bendable area; and an area of an orthographic projection of the bumper on the third side of the support is in a range of approximately 3 $mm^2$ to approximately 40 $mm^2$.

Optionally, the bumper comprises one or more materials selected from a group consisting of rubber, polycarbonate (PC), acrylonitrile butadiene styrene (ABS), foam, and polyethylene terephthalate (PET).

Optionally, the bumper is attached to the respective one of the one or more wire-free portions using double-sided tape.

Optionally, the flexible display apparatus further comprises a case, a portion of which is on a side of the bendable area away from the support; wherein the case and the bendable area is spaced apart from each other; the aperture partially exposes the second side of the support; and a side of the portion of the case closer to the second side of the support is in direct contact with an exposed second side of the support through the aperture.

Optionally, the flexible display apparatus further comprises a case, a portion of which on a side of the bendable area away from the support; wherein the case and the bendable area is spaced apart from each other.

Optionally, the flexible display apparatus further comprises a main support, aback plate, and a cover plate; wherein the main support and the support cooperatively connected with each other, forming a supporting surface for supporting the display area; the cover plate is on a side of the display area away from the main support and the support;

and the back plate is on a side of the main support and the support away from the display area.

Optionally, the plurality of signal lines are a plurality of gate lines, and the driving circuit is a gate driving circuit.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a flexible display apparatus that substantially obviate one or more of the problems due to limitations and disadvantages of the related art. In one aspect, the present disclosure provides a flexible display apparatus. In some embodiments, the flexible display apparatus includes a unitary flexible display panel having a display area, a peripheral area, and a bendable area connecting the display area and the peripheral area. Optionally, the bendable area includes one or more wire-free portions configured to absorb impact applied on the bendable area. Optionally, the flexible display apparatus includes a support sandwiched between the display area and the peripheral area. Optionally, the support has a first side, a second side facing the first side, and a third side connecting the first side and the second side. For example, the display area is on the first side, the peripheral area is on the second side, and the unitary flexible display panel is bend about the third side. Optionally, the flexible display apparatus includes a driving circuit in the peripheral area and connecting to a plurality of signal lines extending through the bendable area into the display area. Optionally, at least one of the plurality of signal lines is a curved signal line including a first portion in the peripheral area, a second portion in the display area, and a third portion at least partially in the bendable area and connecting the first portion and the second portion. Optionally, a virtual extension of at least one of the first portion or the second portion passes through a respective one of the one or more wire-free portions. Optionally, the third portion is substantially outside the respective one of the one or more wire-free portions.

Figure 1A:
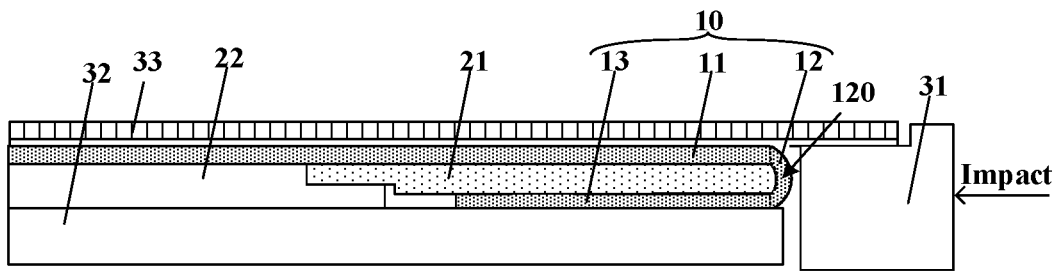
FIG. 1A is a schematic diagram of a partial structure of a flexible display apparatus in some embodiments according to the present disclosure.

FIG. 1A is a schematic diagram of a partial structure of a flexible display apparatus in some embodiments according to the present disclosure. Referring to FIG. 1A, in some embodiments, the flexible display apparatus includes the unitary flexible display panel 10 and a support 21.

Figure 1B:
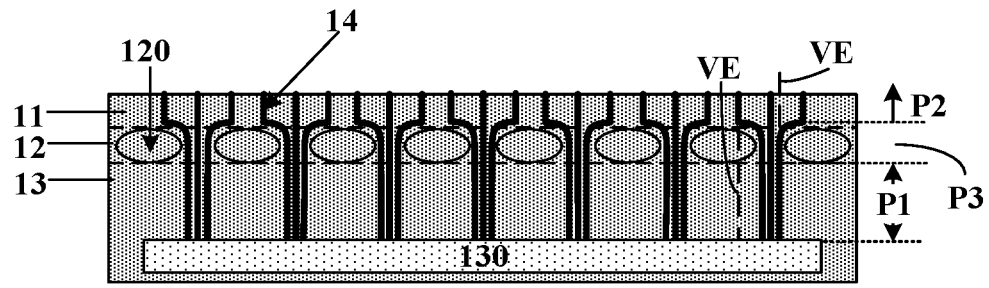
FIG. 1B is a schematic diagram of an unfolded structure of a unitary flexible display panel in some embodiments according to the present disclosure.

FIG. 1B is a schematic diagram of an unfolded structure of a unitary flexible display panel in some embodiments according to the present disclosure. Referring to FIG. 1A and FIG. 1B, in some embodiments, the unitary flexible display panel 10 has a display area 11, a peripheral area 13, and a bendable area 12 connecting the display area 11 and the peripheral area 13. For example, the bendable area 12 is between the display area 11 and the peripheral area 13. Optionally, the display area 11 and the peripheral area 13 are opposite to each other. Optionally, the bendable area 12 includes one or more wire-free portions 120 configured to absorb impact applied on the bendable area 12.

As used herein, the term "display area" refers to an area of a unitary flexible display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels.

As used herein, the term "peripheral area" refers to an area of a unitary flexible display panel where various circuits and wires are provided to transmit signals to a display area of the unitary flexible display panel. To increase the transparency of the flexible display apparatus, non-transparent or opaque components of the flexible display apparatus (e.g., battery, printed circuit board, metal frame), can be disposed in the peripheral area rather than in the display area.

As used herein, the term "bendable" refers to a display panel or a portion thereof that is flexible in one or more direction, including a direction of rotation. For example, the bendable area is an area of the unitary flexible display panel that is flexible in any direction, including a direction of rotation.

Optionally, the unitary flexible display panel 10 includes a plurality of light emitting elements. Optionally, a respective one of the plurality of light emitting elements is an organic light emitting diode (OLED).

Figure 1C:
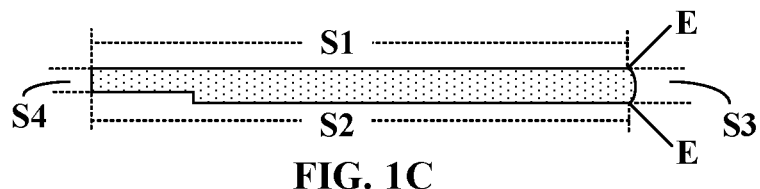
FIG. 1C is a schematic diagram of a structure of a support in some embodiments according to the present disclosure.

FIG. 1C is a schematic diagram of a structure of a support in some embodiments according to the present disclosure. In some embodiments, referring to FIG. 1A and FIG. 1C, the flexible display apparatus includes a support 21 sandwiched between the display area 11 and the peripheral area 13. Optionally, the support 21 has a first side S1, a second side S2 facing the first side S1, and a third side S3 connecting the first side S1 and the second side S2. For example, the display area 11 is on the first side S1, the peripheral area 13 is on the second side S2, and the unitary flexible display panel 10 is bend about the third side S3. The third side S3 of the support 21 is a side closer to the bendable area 12.

Optionally, the support 21 is in a space defined by the display area 11, the peripheral area 13, and the bendable area 12.

Optionally, referring to FIG. 1A and FIG. 1C, the support 21 includes a fourth side S4 opposite to the third side S3. In one example, the fourth side S4 of the support 21 is aligned with an edge of the peripheral area 13 away from the bendable area 12. In another example, a horizontal distance between the fourth side S4 and the third side S3 is greater than a horizontal distance between the edge of the peripheral area 13 away from the bendable area 12 and the third side S3.

Various appropriate materials may be used for making the support. Examples of materials suitable for making the support include, but are not limited to, metals and polymers. Optionally, examples of metals suitable for making the support include, but are not limited to stainless steel, copper, and aluminum. Optionally, examples of polymers suitable for making the support include, but are not limited to the support can be made of polycarbonate (PC), acrylonitrile butadiene styrene (ABS), and foam. For example, referring to FIG. 1A, the support made of various appropriate materials can absorb impacts, an impact applied on a lateral side of the flexible display apparatus closer to the bendable area 12 can be partially absorbed by the support 21, so the support 21 can function as a bumper.

In some embodiments, referring to FIG. 1B, the flexible display apparatus includes a driving circuit 130 in the peripheral area 13 and connecting to a plurality of signal lines 14 extending through the bendable area 12 into the display area 11.

In some embodiments, at least one of the plurality of signal lines 14 is a curved signal line including a first portion P1 in the peripheral area 13, a second portion P2 in the display area 11, and a third portion P3 at least partially in the bendable area 12 and connecting the first portion P1 and the second portion P2.

In some embodiments, a virtual extension VE of at least one of the first portion P1 or the second portion P2 passes through a respective one of the one or more wire-free portions 120. Optionally, the third portion P3 is substantially outside the respective one of the one or more wire-free portions 120.

As used herein, the term "virtual extension" refers to an imaginary line obtained by virtually extending an end of a portion of a respective one of the plurality of the signal lines. In one example, a virtual extension of the first portion P1 is an imaginary line obtained by extending an end of the first portion P1 closer to a respective one of the one or more wire-free portions 120. In another example, a virtual extension of the second portion P2 is an imaginary line obtained by extending an end of the second portion P2 closer to the respective one of the one or more wire-free portions 120.

Optionally, referring to FIG. 1B, the virtual extension VE of the first portion P1 is outside the respective one of the one or more wire-free portions 120, the virtual extension VE of the second portion P2 passes through the respective one of the one or more wire-free portions 120.

Figure 1D:
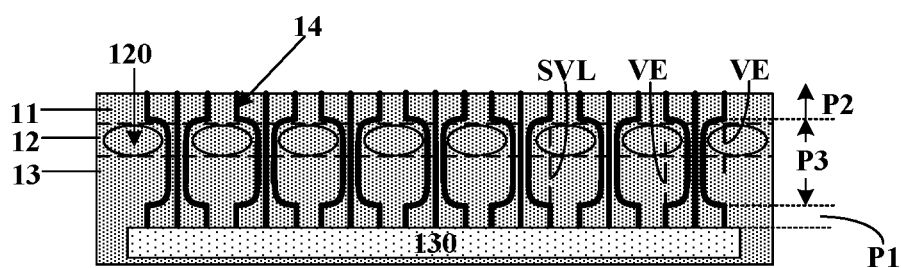
FIG. 1D is a schematic diagram of an unfolded structure of a unitary flexible display panel in some embodiments according to the present disclosure.

FIG. 1D is a schematic diagram of an unfolded structure of a unitary flexible display panel in some embodiments according to the present disclosure. Referring to FIG. 1D, optionally, a straight virtual line SVL connecting the first portion P1 and the second portion P2 passes through the respective one of the one or more wire-free portions 120. Optionally, the first portion and the second portion are substantially co-linear. In one example, the virtual extension VE of the first portion P1 passes through the respective one of the one or more wire-free portions 120. In another example, the virtual extension VE of the second portion P2 passes through the respective one of the one or more wire-free portions 120. Optionally, the third portion P3 is a curved signal line portion detouring around the respective one of the one or more wire-free portions 120.

In some embodiments, referring to FIG. 1B and FIG. 1D, the one or more wire-free portions 120 of the bendable area 12 are free of any of the plurality of signal lines 14. Optionally, the plurality of signal lines 14 are a plurality of gate lines, and the driving circuit 130 is a gate driving circuit.

In some embodiments, referring to FIG. 1A, the flexible display apparatus further includes a main support 22, a back plate 32, and a cover plate 33.

Optionally, the main support 22 and the support 21 are cooperatively connected with each other, forming a supporting surface for supporting the display area 11. Optionally, the cover plate 33 is on a side of the display area 11 away from the main support 22 and the support 21. Optionally, the back plate 32 is on a side of the main support 22 and the support 21 away from the display area 11.

Figure 2:
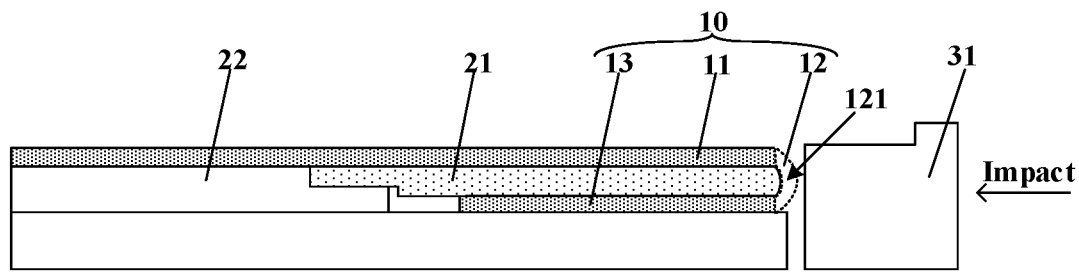
FIG. 2 is a schematic diagram of a partial structure of a flexible display apparatus in some embodiments according to the present disclosure.
Figure 3:
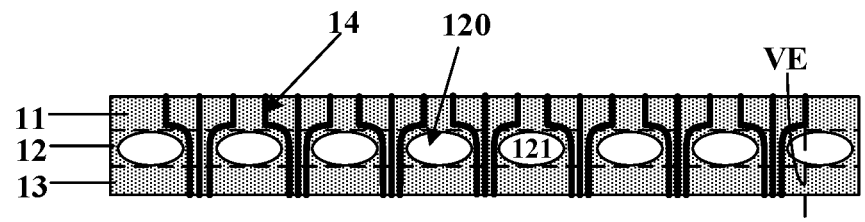
FIG. 3 is a schematic diagram of an unfolded structure of a unitary flexible display panel in some embodiments according to the present disclosure.

FIG. 2 is a schematic diagram of a partial structure of a flexible display apparatus in some embodiments according to the present disclosure. FIG. 3 is a schematic diagram of an unfolded structure of a unitary flexible display panel in some embodiments according to the present disclosure.

Referring to FIG. 2 and FIG. 3, in some embodiments, an aperture 121 is in the respective one of the one or more wire-free portions 120 and extends through the respective one of the one or more wire-free portions 120 of the bendable area 12.

In some embodiments, referring to FIG. 1C and FIG. 2, the aperture 121 partially exposes the third side S3 of the support 21. Optionally, the aperture 121 partially exposes edges E of the third side S3 intersecting the first side S1 and the second side S2 of the support 21. For example, the edges E of the third side S3 are intersections between the third side S3 and the first side S1, and between the third side S3 and the second side S2.

Optionally, the aperture 121 extends from the bendable area 12 to the display area 11 and partially exposes the first side S1 of the support 21. Optionally, the aperture 121 extends from the bendable area 12 to the peripheral area 13 and partially exposes the second side of the support 21.

Referring to FIG. 3, optionally, a total number of the one or more wire-free portions 120 is more than one. So, one or more apertures can be formed on the one or more wire-free portions 120.

Optionally, the one or more apertures are arranged along a midline of the bendable area 12 parallel to the edges of the third side S3 intersecting the first side S1 and the second side S2 of the support 21. Optionally, a normal distance between a center of a respective one of the one or more apertures and an edge connecting the bendable area 12 and the display area 11 is substantially equivalent to a normal distance between the center of the respective one of the one or more apertures and an edge connecting the bendable area 12 and the peripheral area 13.

Figure 4:
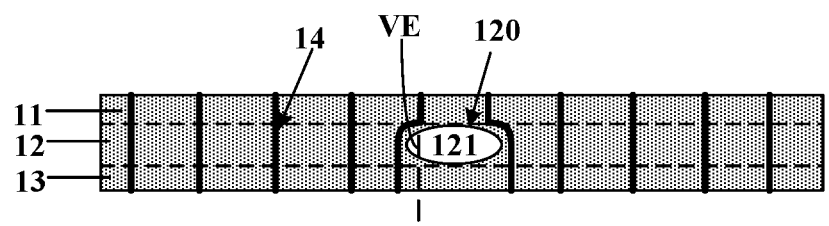
FIG. 4 is a schematic diagram of an unfolded structure of a unitary flexible display panel in some embodiments according to the present disclosure.

FIG. 4 is a schematic diagram of an unfolded structure of a unitary flexible display panel in some embodiments according to the present disclosure. Optionally, referring to FIG. 4, the total number of the one or more wire-free portions 120 is one. The total number of the one or more apertures on the one or more wire-free portions 120 is one.

Optionally, the aperture 121 is in the central region of the bendable area 12. For example, the aperture 121 is in a geometrical center of the bendable area 12. Optionally, an area of the aperture 121 is in a range of approximately 3 mm$^2$ to approximately 40 mm$^2$.

Optionally, a normal distance between a center of the aperture 121 and the edge connecting the bendable area 12 and the display area 11 is substantially equivalent to a normal distance between the center of the aperture 121 and the edge connecting the bendable area 12 and the peripheral area 13.

By forming only one aperture in the peripheral area 13, a small number of signal lines have the curved third portion detouring the aperture, which simplify the process of fabricating the flexible display apparatus. By forming the aperture in the central region of the bendable area 12, the impact applied on the bendable area 12 can be evenly distributed on the support 21 and the unitary flexible display panel 10, which may avoid breakages on the plurality of signal lines 14 due to portions of the plurality of signal lines 14 bear relatively greater pressure than other portions of the plurality of signal lines 14 do.

Referring to FIG. 3 and FIG. 4, in some embodiments, the third portion P3 of the respective one of the plurality of signal lines 14 is the curved signal line portion detouring around the respective one of one or more apertures 121. Optionally, the respective one of one or more apertures 121 is free of any of the plurality of signal lines 14. Optionally, the plurality of signal lines 14 are spaced apart from each other. So, an arrangement of the one or more apertures and a total number of the one or more apertures can be designed based on the arrangement of the plurality of signal lines 14.

In some embodiments, the virtual extension VE of at least one of the first portion P1 or the second portion P2 passes through the aperture 121 in the respective one of the one or more wire-free portions 120. Optionally, the third portion P3 is substantially outside the aperture 121 in the respective one of the one or more wire-free portions 120.

Various appropriate shapes may be adopted to form the aperture. Examples of shapes suitable for the aperture include, but are not limited to, regular shapes and irregular shapes. For example, the regular shapes include, but are not limited to, circular shapes, elliptical shapes, rectangular shapes.

Optionally, referring to FIG. 3 and FIG. 4, a cross-section of the aperture 121 along a plane substantially parallel to the third side S3 and crossing over the aperture 121 has a substantially elliptical shape. Optionally, a minor axis of the elliptical shape is substantially perpendicular to the first side S1 and the second side S2 of the support 21.

Optionally, in order to avoid minor cracks extending from an edge of the aperture 121 to the unitary flexible display panel 10, the aperture 121 has a shape having a radiused angle. For example, the aperture 121 has an elliptical shape. A minor axis of the elliptical shape is substantially perpendicular to the first side S1 and the second side S2 of the support 21. So, a radiused angle of the elliptical shape closer to the display area 11 (e.g., a radiused angle with respect to the minor axis) is greater than a radiused angle of the elliptical shape with respect to a major axis, which may prevent minor cracks from extending toward the display area 11.

In some embodiments, the support can absorb impacts, an impact applied on a lateral side of the flexible display apparatus closer to the bendable area can be partially absorbed by the support, so the support can function as a bumper. In some embodiments, the aperture partially expose the third side of the support or even edges of the third side, when an impact is applied on the lateral side of the flexible display apparatus closer to the bendable area, a portion of the impact will be applied on the exposed third side of the support to prevent the portion of the impact applied on the unitary flexible display panel, which may avoid deformations of the unitary flexible display panel or breakages on the plurality of signal lines 14. By absorbing the portion of the impact using the support, the pressure of the impact should have been sustained by the unitary flexible display panel is reduced, and the pressure of the impact should have been sustained by the plurality of signal lines 14 is also reduced.

Figure 5A:
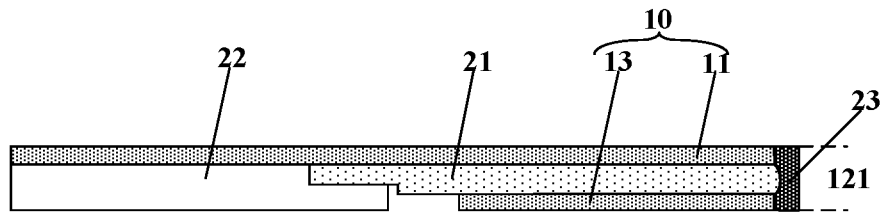
FIG. 5A is a schematic diagram of a partial structure of a flexible display apparatus in some embodiments according to the present disclosure.

FIG. 5A is a schematic diagram of a partial structure of a flexible display apparatus in some embodiments according to the present disclosure. Referring to FIG. 5A, in some embodiments, the flexible display apparatus further includes a bumper 23 in the aperture 121. Optionally, a thickness of the bumper 23 is greater than a thickness of the unitary flexible display panel 10 in the bendable area 12. Optionally, at least one aperture is free of bumper 23.

Figure 5B:
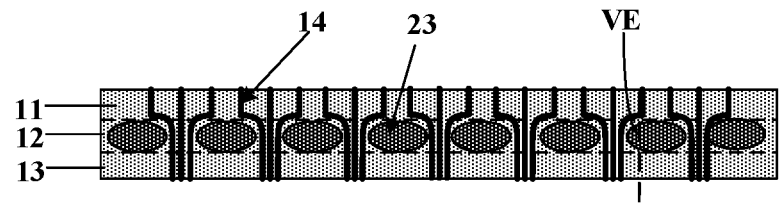
FIG. 5B is a schematic diagram of an unfolded structure of a unitary flexible display panel in some embodiments according to the present disclosure.
Figure 5C:
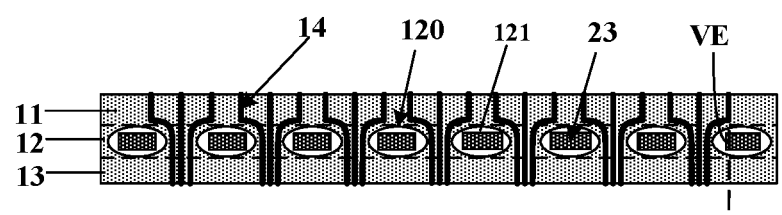
FIG. 5C is a schematic diagram of an unfolded structure of a unitary flexible display panel in some embodiments according to the present disclosure.

FIG. 5B is a schematic diagram of an unfolded structure of a unitary flexible display panel in some embodiments according to the present disclosure. Referring to FIG. 5B, optionally, the bumper 23 is filled in the aperture 121. And the aperture 121 is fully filled with the bumper 23. FIG. 5C is a schematic diagram of an unfolded structure of a unitary flexible display panel in some embodiments according to the present disclosure. Referring to FIG. 5C, optionally, the aperture 121 is partially filled with the bumper 23.

In some embodiments, referring to FIG. 5A to FIG. 5C, one or more wire-free portions 120 of the bendable area 12 are free of any of the plurality of signal lines 14. Optionally, the bumper 23 in the respective one of the one or more wire-free portions 120 of the bendable area 12 are free of any of the plurality of signal lines 14.

Optionally, the virtual extension VE of at least one of the first portion P1 or the second portion P2 passes through the bumper 23 on the respective one of the one or more wire-free portions 120 of the bendable area 12. Optionally, the third portion P3 is substantially outside the bumper 23 on the respective one of the one or more wire-free portions 120 of the bendable area 12.

Optionally, the third portion P3 is a curved signal line portion detouring around the bumper 23 on the respective one of the one or more wire-free portions 120 of the bendable area 12.

Optionally, the bumper 23 and the support 21 include a same material. Optionally, the bumper 23 and the support 21 include different materials.

Various appropriate materials may be used for making the bumper 23. Examples of materials suitable for making the bumper 23 include, but are not limited to, metals or polymers. Optionally, the bumper 23 can be made of stainless steel cooper or aluminum. For example, when the bumper 23 is made of metals, an insulating layer should be formed to cover the surface of the bumper 23 to prevent the plurality of signal lines 14 from being electrically connected to the bumper 23. Optionally, the polymers include, but are not limited to, rubber, foam, polycarbonate (PC), acrylonitrile butadiene styrene (ABS), and polyethylene terephthalate (PET). For example, the polymers can absorb impact, so the bumper 23 made of polymers can have buffering effect.

In some embodiments, the bumper 23 is spaced apart from a portion of a case 31 closer to the bendable area 12.

In some embodiments, the bumper 23 and the support 21 are portions of a unitary structure. Optionally, the bumper 23 is a portion of the support 21 protruding from the third side S3 of the support 21.

In some embodiments, the bumper is in the aperture, and the thickness of the bumper is greater than the thickness of the unitary flexible display panel in the bendable area. When an impact is applied on the lateral side of the flexible display apparatus closer to the bendable area 12, the impact will be applied on the bumper instead of on the unitary flexible display panel, which may avoid deformations of the unitary flexible display panel or breakages on the plurality of signal lines.

Figure 6A:
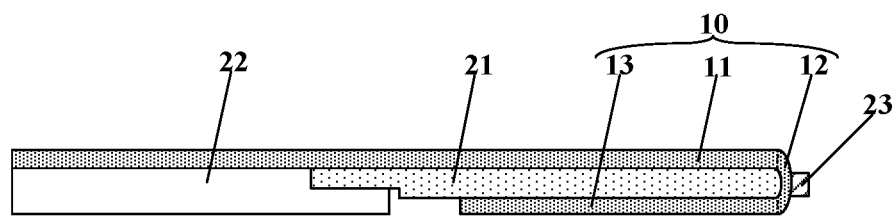
FIG. 6A is a schematic diagram of a partial structure of a flexible display apparatus in some embodiments according to the present disclosure.
Figure 6B:
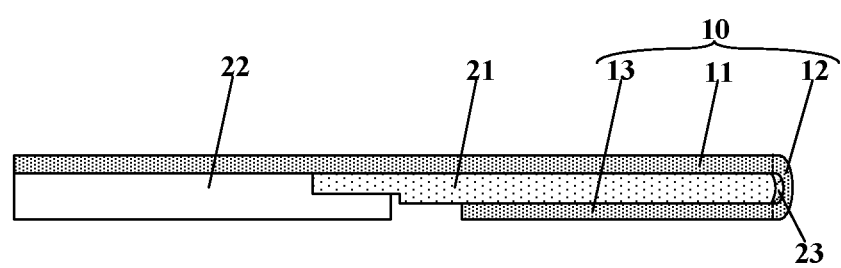
FIG. 6B is a schematic diagram of a partial structure of a flexible display apparatus in some embodiments according to the present disclosure.
Figure 6C:
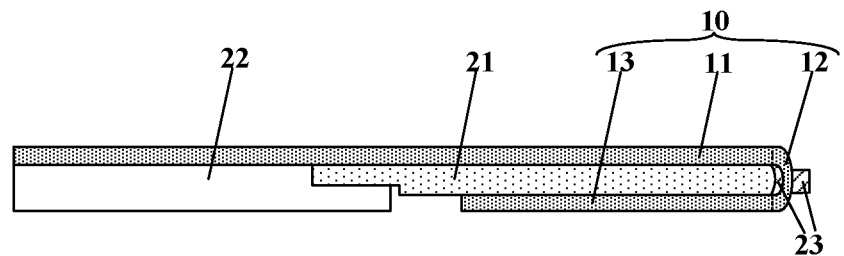
FIG. 6C is a schematic diagram of a partial structure of a flexible display apparatus in some embodiments according to the present disclosure.

FIG. 6A to FIG. 6C are schematic diagrams of a partial structure of a flexible display apparatus in some embodiments according to the present disclosure. In some embodiments, referring to FIG. 1A, and FIG. 6A to FIG. 6C, the bumper 23 is on the respective one of the one or more wire-free portions 120, and configured to absorb impact applied on the bendable area 12.

For example, the flexible display apparatus includes the unitary flexible display panel having the display area 11, the peripheral area 13, and the bendable area 12 connecting the display area 11 and the peripheral area 13. The bendable area 12 includes one or more wire-free portions 120 configured to absorb impact applied on the bendable area 12. The flexible display apparatus includes the bumper 23 on the respective one of the one or more wire-free portions 120, the support 21 sandwiched between the display area 11 and the peripheral area 13, the driving circuit 130 in the peripheral area 13 and connecting to the plurality of signal lines 14 extending through the bendable area 12 into the display area 11. The support 21 has the first side S1, the second side S2 facing the first side S1, and the third side S3 connecting the first side S1 and the second side S2. The display area 11 is on the first side S1, the peripheral area 13 is on the second side S2, and the unitary flexible display panel is bend about the third side S3. At least one of the plurality of signal lines 14 is the curved signal line including the first portion P1 in the peripheral area 13, the second portion P2 in the display area 11, and the third portion P3 at least partially in the bendable area 12 and connecting the first portion P1 and the second portion P2. The virtual extension VE of at least one of the first portion P1 or the second portion P23 passes through the respective one of the one or more wire-free portions 120. The third portion P3 is substantially outside the respective one of the one or more wire-free portions 120.

In some embodiments, a total number of the one or more wire-free portions 120 is one. For example, the bumper 23 is formed on the one wire-free portions 120. Optionally, the bumper 23 is in a central region of the bendable area 12. Optionally, an area of an orthographic projection of the bumper 23 on the third side S3 of the support 21 is in a range of approximately 3 mm$^2$ to approximately 40 mm$^2$.

Optionally, a normal distance between a center of the bumper 23 and the edge connecting the bendable area 12 and the display area 11 is substantially equivalent to a normal distance between the center of the bumper 23 and the edge connecting the bendable area 12 and the peripheral area 13.

In some embodiments, the total number of the one or more wire-free portions 120 is more than one. One or more bumpers are formed on the one or more wire-free portions 120 of the bendable area 12.

Optionally, the one or more bumpers are arranged along a midline of the bendable area 12 parallel to one of the edges of the third side S3 intersecting the first side S1 and the second side S2 of the support 21. Optionally, a normal distance between a center of a respective one of the one or more bumpers and the edge connecting the bendable area 12 and the display area 11 is substantially equivalent to a normal distance between the center of the respective one of the one or more bumpers and the edge connecting the bendable area 12 and the peripheral area 13.

Figure 7:
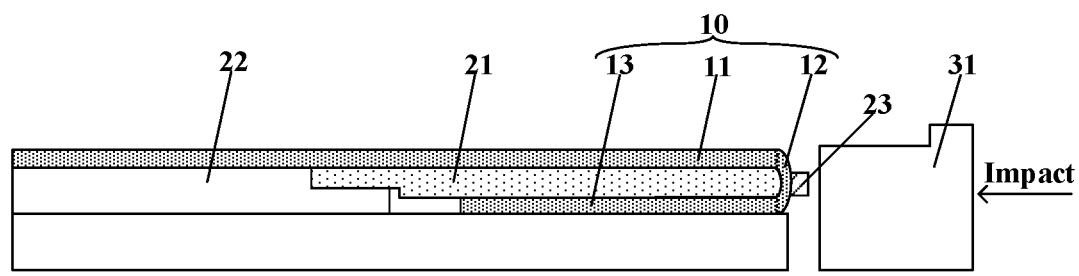
FIG. 7 is a schematic diagram of a partial structure of a flexible display apparatus in some embodiments according to the present disclosure.

In some embodiments, referring to FIG. 6A and FIG. 7, the bumper 23 is on a side of the respective one of the one or more wire-free portions 120 away from the support 21, and configured to prevent the portion of the case 31 closer to the bendable area 12 from hitting the bendable area 12 when an impact in applied to the case 31.

In some embodiments, referring to FIG. 6B, the bumper 23 is between the third side S3 of the support 21 and a side of the respective one of the one or more wire-free portions 120 closer to the support 21.

In some embodiments, referring to FIG. 6C, one of the one or more bumpers is on the side of the respective one of the one or more wire-free portions 120 away from the support 21, and another one of the one or more bumpers is between the third side S3 of the support 21 and the side of the respective one of the one or more wire-free portions 120 closer to the support 21.

Figure 8:
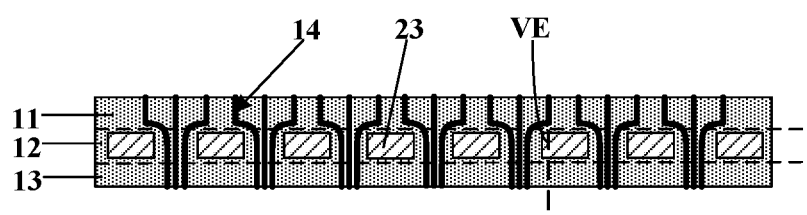
FIG. 8 is a schematic diagram of an unfolded structure of a unitary flexible display panel in some embodiments according to the present disclosure.
Figure 9:
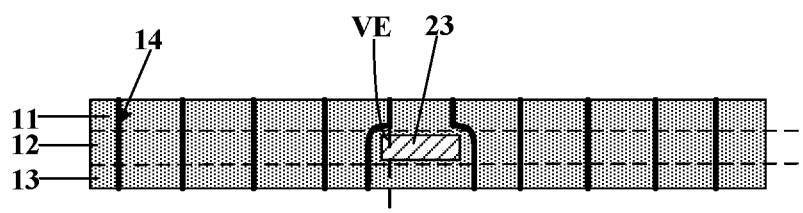
FIG. 9 is a schematic diagram of an unfolded structure of a unitary flexible display panel in some embodiments according to the present disclosure.

FIG. 8 is a schematic diagram of an unfolded structure of a unitary flexible display panel in some embodiments according to the present disclosure. FIG. 9 is a schematic diagram of an unfolded structure of a unitary flexible display panel in some embodiments according to the present disclosure. Referring to FIG. 1B, FIG. 8 and FIG. 9, in some embodiments, one or more wire-free portions 120 of the bendable area 12 are free of any of the plurality of signal lines 14. Optionally, the bumper 23 on the respective one of the one or more wire-free portions 120 of the bendable area 12 are free of any of the plurality of signal lines 14.

Optionally, the virtual extension VE of at least one of the first portion P1 or the second portion P23 passes through the bumper 23 on the respective one of the one or more wire-free portions 120 of the bendable area 12. Optionally, the third portion P3 is substantially outside the bumper 23 on the respective one of the one or more wire-free portions 120 of the bendable area 12.

Optionally, the plurality of signal lines 14 are spaced apart from the bumper 23 on the respective one of the one or more wire-free portions 120 of the bendable area 12.

Optionally, referring to FIG. 6A to FIG. 6C, the support 21 includes the fourth side S4 opposite to the third side S3. In one example, the fourth side S4 of the support 21 is aligned with the edge of the peripheral area 13 away from the bendable area 12. In another example, a horizontal distance between the fourth side S4 and the third side S3 is greater than a horizontal distance between the edge of the peripheral area 13 away from the bendable area 12 and the third side S3.

Optionally, referring to FIG. 1A, and FIG. 6A to FIG. 6C, the flexible display apparatus further includes the main support 22, the back plate 32, and the cover plate 33. Optionally, the main support 22 and the support 21 are cooperatively connected with each other, forming the supporting surface for supporting the display area 11. Optionally, the cover plate 33 is on the side of the display area 11 away from the main support 22 and the support 21. Optionally, the back plate 32 is on the side of the main support 22 and the support 21 away from the display area 11.

Various appropriate materials may be used for making the bumper 23. Examples of materials suitable of making the bumper 23 include, but are not limited to, insulating materials, to avoid electrical connection between the bumper 23 and a respective one of the plurality of signal lines 14.

Optionally, the bumper 23 includes one or more materials selected from a group consisting of rubber, polycarbonate (PC), acrylonitrile butadiene styrene (ABS), foam, and polyethylene terephthalate (PET).

In some embodiments, when an impact is applied on the lateral side of the flexible display apparatus closer to the bendable area, the bumper on a side of the respective one of the one or more wire-free portions away from the support can absorb the impact, and prevent the impact from being applied on the unitary flexible display panel, which may avoid deformations of the unitary flexible display panel or breakages on the plurality of signal lines.

In some embodiments, when an impact is applied on the lateral side of the flexible display apparatus closer to the bendable area, the bumper between the third side of the support and the side of the respective one of the one or more wire-free portions closer to the support can absorb the impact applied on the unitary flexible display panel, to diminish the problems of deformations of the unitary flexible display panel or breakages on the plurality of signal lines.

By forming only one bumper in the peripheral area, a small number of signal lines of the plurality of signal lines have a curved third portion detouring the aperture, which simplify the process of fabricating the flexible display apparatus. By forming the bumper in the central region of the bendable area, the impact applied on the bendable area can be evenly distributed on the support and the flexible display panel, which may avoid breakages on the plurality of signal lines due to portions of the plurality of signal lines bear relatively greater pressure and other portions of the plurality of signal lines do.

In some embodiments, the bumper 23 is attached to the respective one of the one or more wire-free portions 120 using double-sided tape.

Figure 10:
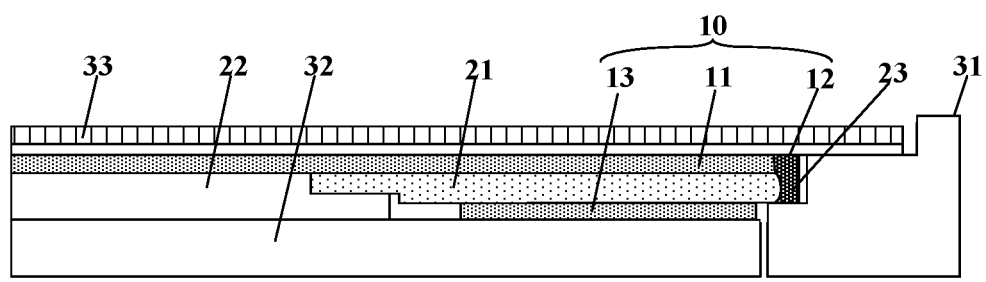
FIG. 10 is a schematic diagram of a partial structure of a flexible display apparatus in some embodiments according to the present disclosure.

FIG. 10 is a schematic diagram of a partial structure of a flexible display apparatus in some embodiments according to the present disclosure. Referring to FIG. 10, in some embodiments, the flexible display apparatus further includes the case 31. Optionally, a portion of the case 31 is on a side of the bendable area 12 away from the support 21. Optionally, the case 31 and the bendable area 12 is spaced apart from each other.

In some embodiments, referring to FIG. 1C, FIG. 2 and FIG. 10, the aperture 121 is in the respective one of the one or more wire-free portions 120. Optionally, the respective one of the one or more wire-free portions 120 extends from the bendable area 12 to the peripheral area 13. Optionally, the aperture 121 extends from the bendable area 12 to the peripheral area 13 to partially expose the second side S2 of the support 21. In one example, the aperture 121 extends to the edge of the peripheral area 13 away from the bendable area 12. In another example, the aperture 121 extends beyond an edge of the peripheral area 13 connecting with the bendable area 12, but without reaching the edge of the peripheral area 13 away from the bendable area 12.

In some embodiments, a portion of the case 31 closer to the second side S2 of the support 21 is spaced apart from the unitary flexible display panel 10, and is in direct contact with the second side S2 of the support 21 through the aperture 121.

Figure 11:
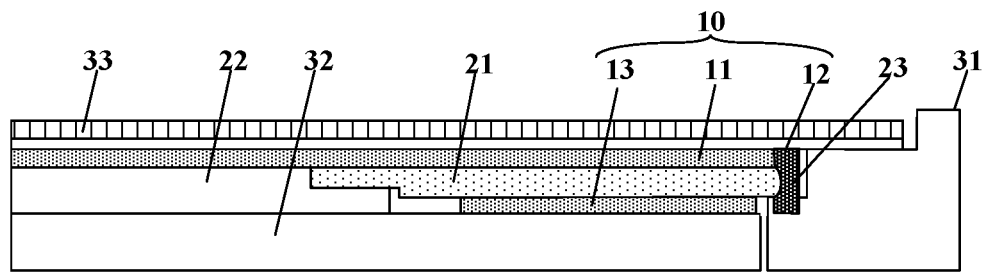
FIG. 11 is a schematic diagram of a partial structure of a flexible display apparatus in some embodiments according to the present disclosure.

In some embodiments, referring to FIG. 2 and FIG. 10, the aperture 121 is partially filed with the bumper 23. Optionally, referring to FIG. 2 and FIG. 11, a portion of the aperture 121 in the bendable area 12 is fully filed with the bumper 23.

Optionally, no bumper is disposed in the aperture 121. Optionally, no bumper is disposed on the one or more wire-free portions 120.

In some embodiments, the portion of the case is indirect contact with the support, since the support is fixed on the case, the unitary flexible display panel on the support can also be fixed. So, the case indirectly supports the flexible display panel. Optionally, the flexible display apparatus also includes the back plate, when an impact is applied on the portion of the case closer to the bendable area, the back plate can also sustain a portion of impact applied on the case, which may reduce the remaining portion of impact applied on the unitary flexible display panel, and diminish deformations of the unitary flexible display panel or breakages on the plurality of signal lines.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first". "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A flexible display apparatus, comprising:
a unitary flexible display panel having a display area, a peripheral area, and a bendable area connecting the display area and the peripheral area, wherein the bendable area comprises one or more base layers and a plurality of signal lines on the one or more base layers, the plurality of signal lines are absent in one or more wire-free portions;
a support sandwiched between the display area and the peripheral area, wherein the support has a first side, a second side facing the first side, and a third side connecting the first side and the second side, the display area is on the first side, the peripheral area is on the second side, and the unitary flexible display panel is bent about the third side, wherein the support is separated from the one or more base layers of the bendable area;
a driving circuit in the peripheral area and connecting to a plurality of signal lines extending through the bendable area into the display area;
an aperture extending through the one or more base layers in a respective one of the one or more wire-free portions of the bendable area; and
a bumper inserted into the aperture extending through the one or more base layers, wherein the bumper is separated and spaced apart from the one or more base layers of the bendable area, and protrudes away from the third side;
wherein a portion of the bumper protruding away from the third side is exposed;
at least one of the plurality of signal lines is a curved signal line including a first portion in the peripheral area, a second portion in the display area, and a third portion at least partially in the bendable area and connecting the first portion and the second portion;
a virtual extension of at least one of the first portion or the second portion passes through a respective one of the one or more wire-free portions;
a virtual extension of the third portion is non-intersecting with the respective one of the one or more wire-free portions;
the third portion is substantially outside the respective one of the one or more wire-free portions;
an orthographic projection of the bumper on the one or more base layers is non-overlapping with an orthographic projection of the plurality of signal lines on the one or more base layers; and
the bumper is made of an insulating material;
wherein the support does not extend throughout the display area;
the bumper and the support are portions of a unitary structure.

2. The flexible display apparatus of claim 1, wherein a virtual extension of the first portion is outside a respective one of the one or more wire-free portions; and a virtual extension of the second portion passes through the respective one of the one or more wire-free portions.

3. The flexible display apparatus of claim 1, wherein a straight virtual line connecting the first portion and the second portion passes through a respective one of the one or more wire-free portions; and
the third portion is a curved signal line portion detouring around the respective one of the one or more wire-free portions.

4. The flexible display apparatus of claim 1, wherein the bumper is at least partially on a side of the one or more wire-free portions of the bendable area away from the support; and
a thickness of the bumper is greater than a thickness of the unitary flexible display panel in the bendable area.

5. The flexible display apparatus of claim 1, wherein the aperture partially exposes edges of the third side intersecting the first side and the second side of the support.

6. The flexible display apparatus of claim 1, wherein a total number of the one or more wire-free portions is one; the aperture is in a central region of the bendable area; and
an area of the aperture is in a range of approximately 3 $mm^2$ to approximately 40 $mm^2$.

7. The flexible display apparatus of claim 1, wherein a cross-section of the aperture along a plane substantially parallel to the third side and crossing over the aperture has a substantially elliptical shape; and
a minor axis of the substantially elliptical shape is substantially perpendicular to the first side and the second side of the support.

8. The flexible display apparatus of claim 1, wherein the bumper comprises one or more materials selected from a group consisting of rubber, polycarbonate (PC), acrylonitrile butadiene styrene (ABS), foam, and polyethylene terephthalate (PET).

9. The flexible display apparatus of claim 1, further comprising a case, a portion of which on a side of the bendable area away from the support;
wherein the case and the bendable area is spaced apart from each other.

10. The flexible display apparatus of claim 1, further comprising a main support, a back plate, and a cover plate;
wherein the main support and the support cooperatively connected with each other, forming a supporting surface for supporting the display area;
the cover plate is on a side of the display area away from the main support and the support; and
the back plate is on a side of the main support and the support away from the display area.

11. The flexible display apparatus of claim 1, wherein the plurality of signal lines are a plurality of gate lines, and the driving circuit is a gate driving circuit.

12. A flexible display apparatus, comprising:
a unitary flexible display panel having a display area, a peripheral area, and a bendable area connecting the display area and the peripheral area, wherein the bendable area comprises one or more base layers and a plurality of signal lines on the one or more base layers, the plurality of signal lines are absent in one or more wire-free portions;
a support sandwiched between the display area and the peripheral area, wherein the support has a first side, a second side facing the first side, and a third side connecting the first side and the second side, the display area is on the first side, the peripheral area is on the second side, and the unitary flexible display panel is bent about the third side, wherein the support is separated from the one or more base layers of the bendable area;

a driving circuit in the peripheral area and connecting to a plurality of signal lines extending through the bendable area into the display area;

an aperture extending through the one or more base layers in a respective one of the one or more wire-free portions of the bendable area; and a bumper inserted into the aperture extending through the one or more base layers, wherein the bumper is separated and spaced apart from the one or more base layers of the bendable area, and protrudes away from the third side;

wherein a portion of the bumper protruding away from the third side is exposed;

at least one of the plurality of signal lines is a curved signal line including a first portion in the peripheral area, a second portion in the display area, and a third portion at least partially in the bendable area and connecting the first portion and the second portion;

a virtual extension of at least one of the first portion or the second portion passes through a respective one of the one or more wire-free portions;

a virtual extension of the third portion is non-intersecting with the respective one of the one or more wire-free portions;

the third portion is substantially outside the respective one of the one or more wire-free portions;

an orthographic projection of the bumper on the one or more base layers is non-overlapping with an orthographic projection of the plurality of signal lines on the one or more base layers; and the bumper is made of an insulating material;

wherein the bumper is attached to the respective one of the one or more wire-free portions using double-sided tape.

\* \* \* \* \*